(12) United States Patent
Zhai

(10) Patent No.: US 11,367,845 B2
(45) Date of Patent: Jun. 21, 2022

(54) STRETCHABLE DISPLAY PANEL AND STRETCHABLE DISPLAY DEVICE

(71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 149 days.

(21) Appl. No.: 17/037,372

(22) Filed: Sep. 29, 2020

(65) Prior Publication Data
US 2021/0013433 A1 Jan. 14, 2021

(30) Foreign Application Priority Data
Aug. 7, 2020 (CN) .......................... 202010790164.4

(51) Int. Cl.
*H01L 51/00* (2006.01)
*H01L 27/32* (2006.01)
*G09G 3/00* (2006.01)
*B32B 3/26* (2006.01)

(52) U.S. Cl.
CPC .......... *H01L 51/0097* (2013.01); *B32B 3/263* (2013.01); *G09G 3/035* (2020.08); *H01L 27/3276* (2013.01); *B32B 2457/20* (2013.01); *H01L 2251/5338* (2013.01)

(58) Field of Classification Search
CPC ............. H01L 51/0097; H01L 27/3276; H01L 2251/5338; B32B 3/263; B32B 2457/20; G09G 3/035; Y02E 10/549; G09F 9/301
See application file for complete search history.

(56) References Cited

U.S. PATENT DOCUMENTS

| 2018/0046221 A1* | 2/2018 | Choi | ................... G02B 26/0825 |
| 2019/0207131 A1* | 7/2019 | Lu | ........................ H01L 51/0097 |
| 2019/0280077 A1* | 9/2019 | Park | ..................... H01L 27/3262 |

FOREIGN PATENT DOCUMENTS

CN          107731866 A         2/2018

OTHER PUBLICATIONS

First Chinese Office Action dated Nov. 3, 2021, issued in corresponding Chinese Application No. 202010790164.4, filed on Aug. 7, 2020, and its English translation thereof, 10 pages.

\* cited by examiner

*Primary Examiner* — Kyoung Lee
(74) *Attorney, Agent, or Firm* — Christensen O'Connor Johnson Kindness PLLC

(57) ABSTRACT

A stretchable display panel and a stretchable display device are provided. The stretchable display panel includes a stretchable substrate including island structures and bridge structures, and two adjacent island structures are connected by the bridge structure. The island structure includes a first carrier substrate and a first display layer including a pixel unit, and the bridge structure comprises a second carrier substrate and a second display layer including a signal line. The bridge structure has a first cross section perpendicular to a plane of the second carrier substrate and perpendicular to an extending direction of the bridge structure. A maximum width W1 of the first cross section in a first direction is smaller than or equal to maximum thickness H1 of the bridge structure in the direction perpendicular to the plane, and the first direction is parallel to the plane and perpendicular to the extending direction.

20 Claims, 10 Drawing Sheets

STRETCHABLE DISPLAY PANEL AND STRETCHABLE DISPLAY DEVICE

CROSS-REFERENCE TO RELATED APPLICATIONS

The present application claims priority to Chinese Patent Application No. 202010790164.4, filed on Aug. 7, 2020, the content of which is incorporated herein by reference in its entirety.

TECHNICAL FIELD

The present disclosure relates to the field of display technologies and, in particular, to a stretchable display panel and a stretchable display device.

BACKGROUND

With the continuous development of flexible display technologies, stretchable display panels are gradually applied in fields such as wearable devices, internet of Things devices, artificial intelligence, bringing users a brand-new viewing and using experience.

In the related art, a stretchable display panel includes pixel islands and stretch bridges, two adjacent ones of the pixel islands are connected by the stretch bridge, the pixel island is configured to carry display function elements, and the stretch bridge is configured to carry signal lines that provide signals to the display function elements. However, during a stretching process of the stretchable display panel, the stretch bridge is likely to be bent and deformed in a light-emitting direction of the display panel, resulting in warping of the stretchable display panel, which affects a display effect.

SUMMARY

In an aspect, an embodiment of the present disclosure provides a stretchable display panel, and the stretchable display panel includes a stretchable substrate, and the stretchable substrate includes a plurality of island structures and a plurality of bridge structures. The plurality of island structures is spaced apart from each other, and two adjacent ones of the plurality of island structures are connected by one of the plurality of bridge structures. Each of the plurality of island structures includes a first carrier substrate and a first display layer, the first display layer is disposed at a side of the first carrier substrate facing towards a light-emitting direction of the stretchable display panel, and the first display layer incudes a pixel unit. Each of the plurality of bridge structures includes a second carrier substrate and a second display layer, and the second display layer is disposed at a side of the second carrier substrate facing towards the light-emitting direction and includes a signal line electrically connected to the pixel unit. Each of the plurality of bridge structures has a first cross section perpendicular to a plane of the second carrier substrate. The first cross section is perpendicular to an extending direction of the bridge structure, a maximum width of the first cross section in a first direction is W1, a maximum thickness of the bridge structure in the direction perpendicular to the plane of the second carrier substrate is H1, H1≥W1, and the first direction is parallel to the plane of the second carrier substrate and perpendicular to the extending direction of the bridge structure.

In another aspect, an embodiment of the present disclosure provides a stretchable display device including a stretchable display panel. The stretchable display panel includes a stretchable substrate, and the stretchable substrate includes a plurality of island structures and a plurality of bridge structures. The plurality of island structures is spaced apart from each other, and two adjacent ones of the plurality of island structures are connected by one of the plurality of bridge structures. Each of the plurality of island structures includes a first carrier substrate and a first display layer, the first display layer is disposed at a side of the first carrier substrate facing towards a light-emitting direction of the stretchable display panel, and the first display layer incudes a pixel unit. Each of the plurality of bridge structures includes a second carrier substrate and a second display layer, and the second display layer is disposed at a side of the second carrier substrate facing towards the light-emitting direction and includes a signal line electrically connected to the pixel unit. Each of the plurality of bridge structures has a first cross section perpendicular to a plane of the second carrier substrate. The first cross section is perpendicular to an extending direction of the bridge structure, a maximum width of the first cross section in a first direction is W1, a maximum thickness of the bridge structure in the direction perpendicular to the plane of the second carrier substrate is H1, H1≥W1, and the first direction is parallel to the plane of the second carrier substrate and perpendicular to the extending direction of the bridge structure.

BRIEF DESCRIPTION OF DRAWINGS

In order to more clearly illustrate technical solutions of embodiments of the present disclosure, the accompanying drawings required to be used in the embodiments are briefly described below. Obviously, the drawings described below are representative embodiments of the present disclosure.

DESCRIPTION OF EMBODIMENTS

In order to better understand technical solutions of the present disclosure, the embodiments of the present disclosure are described in detail with reference to the drawings.

It should be clear that the described embodiments are only some embodiments of the present disclosure, not all the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is merely an association describing the associated object, indicating that there can be three relationships. For example, A and/or B can indicate three cases: only A exists; A and B exist concurrently; only B exists. In addition, a character "/" herein generally indicates that the contextual objects are in an "or" relationship.

It should be understood that although the terms first and second can be used to describe carrier substrates and display layers in the embodiments of the present disclosure, however, these carrier substrates and display layers should not be limited to these terms. These terms are only used to distinguish the carrier substrate and display layers from each other. For example, without departing from the scope of the embodiments of the present disclosure, the first carrier substrate can also be referred to as the second carrier substrate, and similarly, the second carrier substrate can also be referred to as the first carrier substrate.

Figure 1:
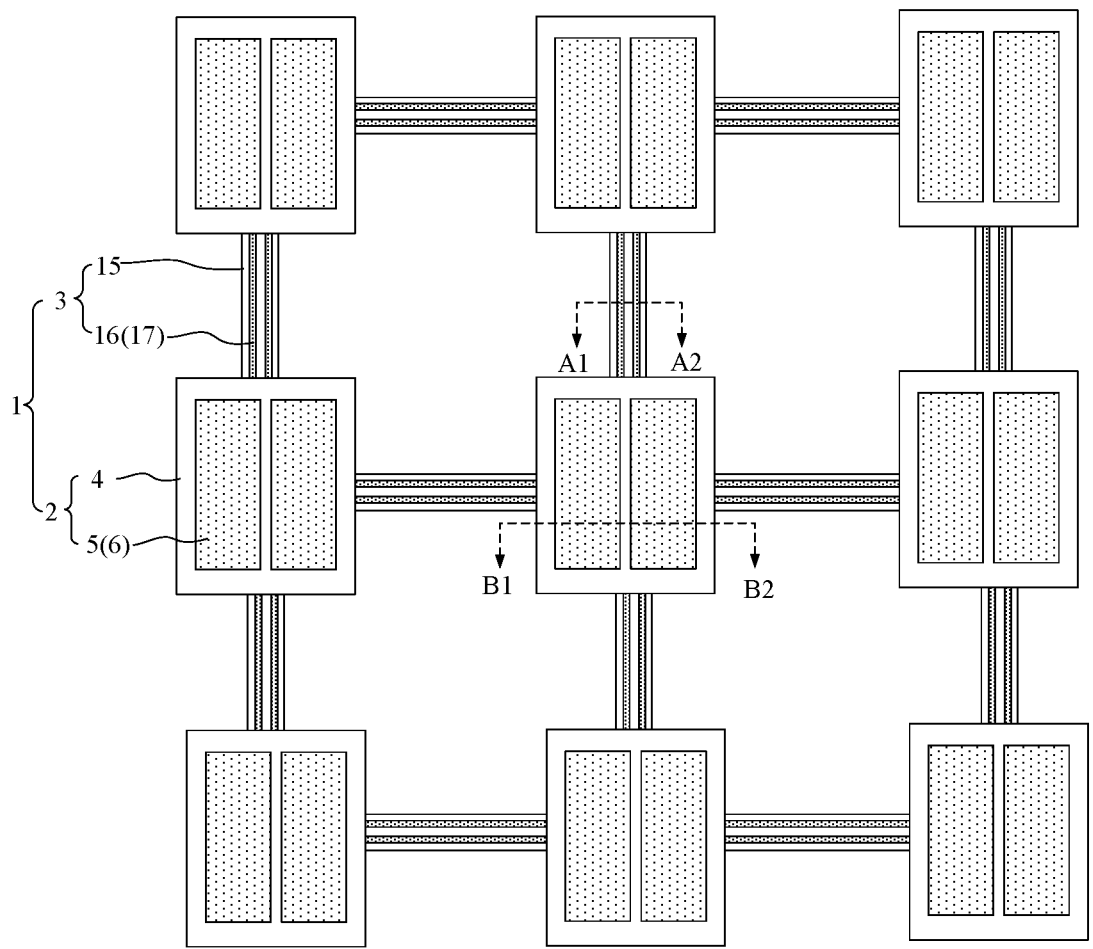
FIG. 1 is a schematic diagram of a stretchable display panel provided by an embodiment of the present disclosure.
Figure 2:
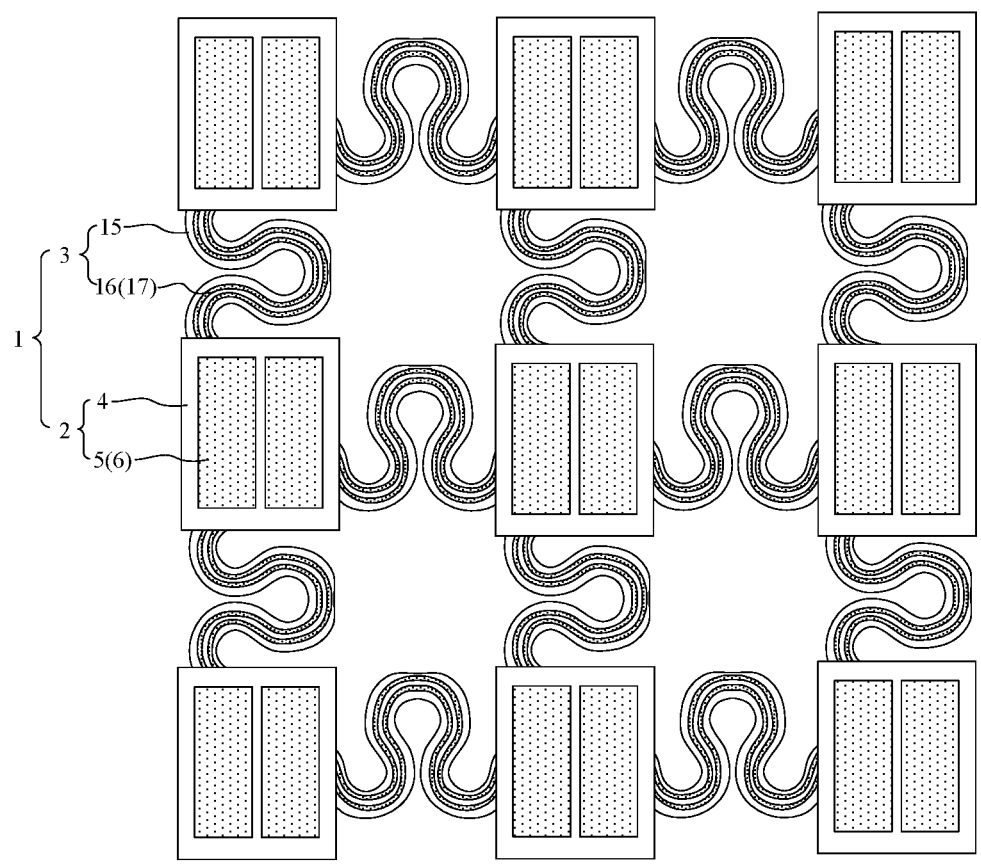
FIG. 2 is a schematic diagram of a stretchable display panel provided by an embodiment of the present disclosure.

An embodiment of the present disclosure provides a stretchable display panel, as shown in FIG. 1 and FIG. 2. FIG. 1 is a schematic diagram of a stretchable display panel provided by the embodiment of the present disclosure, and FIG. 2 is another schematic diagram of the stretchable display panel provided by the embodiment of the present disclosure. The stretchable display panel includes a stretchable substrate 1, the stretchable substrate 1 includes a plurality of island structures 2 and a plurality of bridge structures 3, the plurality of the island structures 2 is spaced apart from each other, and two adjacent island structures 2 are connected by the bridge structure 3. The bridge structure 3 can be a linear bridge structure 3 shown in FIG. 1, and it can also be a serpentine bridge structure 3 shown in FIG. 2. Taking the serpentine bridge structure 3 as an example, when the stretchable display panel is not stretched, the bridge structure 3 is in a natural curved state, and when the stretchable display panel is stretched, the bridge structure 3 is deformed under an effect of a stretching force and can be stretched into an approximate linear state at most.

Figure 3:
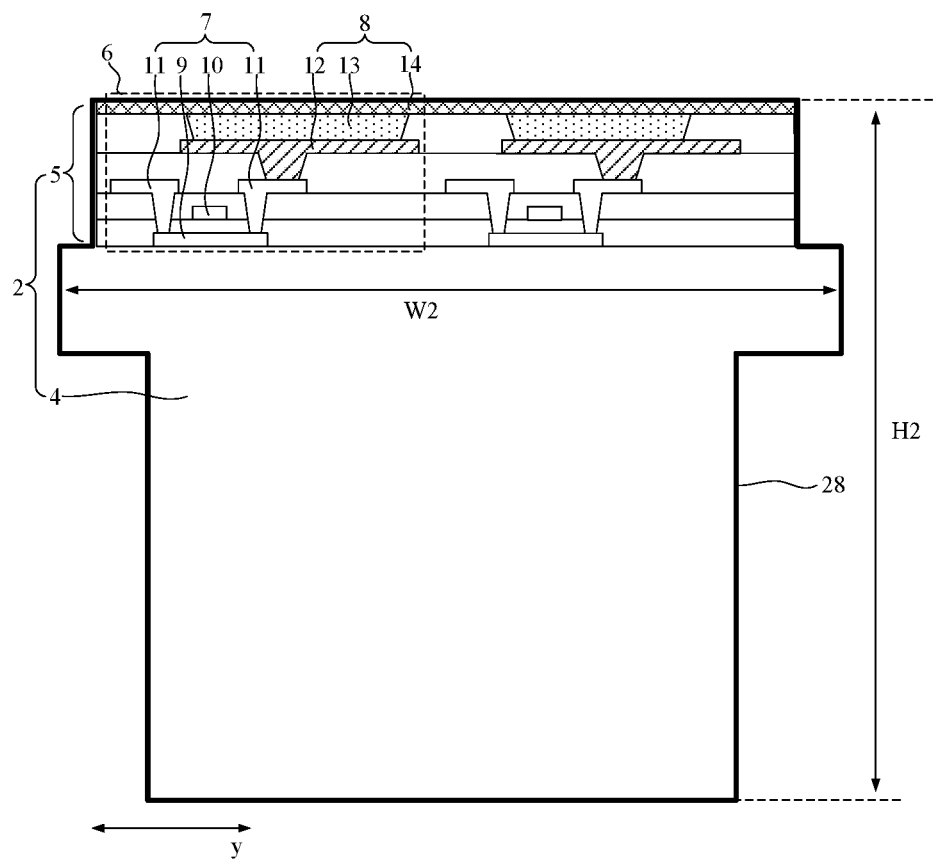
FIG. 3 is a cross-sectional diagram of a stretchable display panel taken along a line A1-A2 shown in FIG. 1.
Figure 4:
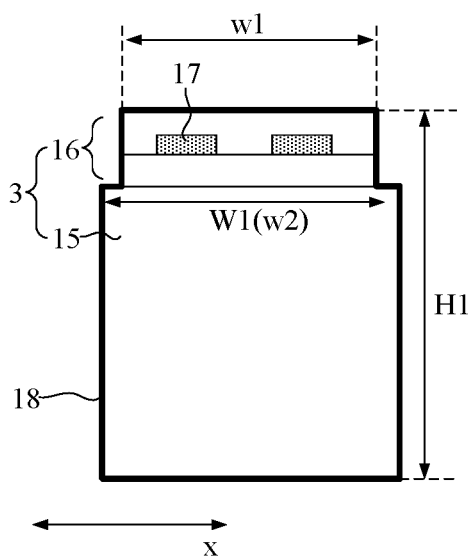
FIG. 4 is a cross-sectional diagram of a stretchable display panel taken along a line B1-B2 shown in FIG. 1.
Figure 5:
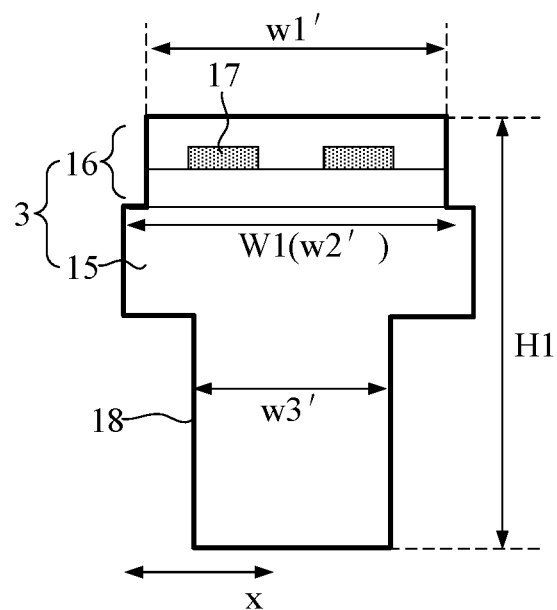
FIG. 5 is a cross-sectional diagram of a stretchable display panel taken along a line B1-B2 shown in FIG. 1.

FIG. 3 is a cross-sectional diagram of a stretchable display panel taken along a line A1-A2 shown in FIG. 1, the island structure 2 includes a first carrier substrate 4 and a first display layer 5, the first display layer 5 is provided at a side of the first carrier substrate 4 facing towards a light-emitting direction of the stretchable display panel, and the first display layer 5 includes at least one pixel unit 6. In an embodiment, the pixel unit 6 includes a pixel driving circuit 7 and an organic light-emitting diode 8, and the pixel driving circuit 7 is configured to provide a driving current to the organic light-emitting diode 8 to drive the organic light-emitting diode 8 to emit light. The pixel driving circuit 7 includes an active layer 9, a gate layer 10, and a source-drain layer 11 which are sequentially arranged along the light-emitting direction, the organic light-emitting diode 8 includes an anode layer 12, a light-emitting layer 13 and a cathode layer 14 which are sequentially arranged along the light-emitting direction, and the active layer 9, the gate layer 10, the source-drain layer 11, the anode layer 12, the light-emitting layer 13, the cathode layer 14, and insulating layers located between any two of the layers above form the first display layer 5. As shown in FIG. 4 and FIG. 5, FIG. 4 is a cross-sectional diagram of a stretchable display panel taken along a line B1-B2 shown in FIG. 1, FIG. 5 is a cross-sectional diagram of a stretchable display panel taken along a line B1-B2 shown in FIG. 1, the bridge structure 3 includes a second carrier substrate 15 and a second display layer 16, the second display layer 16 is provided at a side of the second carrier substrate 15 facing towards the light-emitting direction, and the second display layer 16 includes signal lines 17 electrically connected to the pixel unit 6, such as gate lines, data lines, and power signal lines 17, etc.

Referring to FIG. 4 and FIG. 5 again, the bridge structure 3 has a first cross section 18, the first cross section 18 is perpendicular to a plane of the second carrier substrate 15 and perpendicular to an extending direction of the bridge structure 3. A maximum width of the first cross section 18 in a first direction x is W1, a maximum thickness of the bridge structure 3 in the direction perpendicular to the plane of the second carrier substrate 15 is H1, H1≥W1, the first direction x is parallel to the plane of the second carrier substrate 15 and perpendicular to the extending direction of the bridge structure 3.

Referring to FIG. 4 and FIG. 5 again, when a shape of the first cross section 18 is non-rectangular, the first cross section 18 can have a plurality of different widths in the first direction x, for example, w1, w2 shown in FIG. 4, and w1', w2' and w3' shown in FIG. 5, and the maximum width W1 of the first cross section 18 refers to the maximum value among the plurality of widths. Similarly, when the bridge structure 3 has different thicknesses in the direction perpendicular to the plane of the second carrier substrate 15, the maximum thickness H1 of the bridge structure 3 refers to the maximum value among the plurality of thicknesses.

When the stretchable display panel is stretched, under the stretching force, the bridge structure 3 will be bent and deformed in different directions. When the bridge structure 3 is bent in the direction perpendicular to the plane of the second carrier substrate 15 (hereinafter referred to as longitudinal bending), work required is Wz, $Wz=½*\theta*H1^3*W*E$, and when the bridge structure 3 is bent in the first direction x, the work required is Wx, $Wx=½*\theta*W^3*H1*E$, where E is Young's modulus of the bridge structure 3, W is an average width of the bridge structure 3 in the first direction x, and $\theta$ is curvature of the bridge structure 3. It should be noted that the average width W of the bridge structure 3 in the first direction x refers to an average width of an entire structure of the bridge structure 3. For example, referring to FIG. 5 again, an average value of w1', w2' and w3' can be regarded as the average width W of the bridge structure 3 in the first direction x, and it can be seen that the average width W is smaller than or equal to the maximum width W1, thus when the maximum thickness H1 is greater than or equal to the maximum width W1, the maximum thickness H1 is also be greater than or equal to the average width W.

It can be seen that influence of the maximum thickness H1 on Wz is much greater than influence of the maximum thickness H1 on Wx, and when H1=W, Wz=Wx, as H1 further increases, the work required for the longitudinal bending of the bridge structure 3 is much greater than the work required for bending in the first direction x, thus when the bridge structure 3 has a relatively large H1, the bridge structure 3 is more likely to be bent in the first direction x, and less likely to be longitudinally bent.

Based on the above, in the stretchable display panel provided by the embodiments of the present disclosure, the bridge structure 3 is thickened and/or width-reduced, and the maximum thickness H1 of the bridge structure 3 is configured to be greater than or equal to the maximum width W1, which can make the bridge structure 3 have a relatively large thickness, so that when the stretchable display panel is stretched, relatively large work is required to make the bridge structure 3 be bent longitudinally, to reduce a possibility of the longitudinal bending of the bridge structure 3, thereby reducing a risk of warping of the stretchable display panel, and improving the display performance.

In addition, it should be noted that when the stretchable display panel is stretched, deformation amounts of the maximum width and maximum thickness of the bridge structure 3 are both relatively small. Therefore, the maximum width and the maximum thickness corresponding to the bridge structure 3 can refer to the maximum width and the maximum thickness of the bridge structure 3 when the stretchable display panel is stretched, or refer to the maximum width and the maximum thickness of the bridge structure 3 when the stretchable display panel is not stretched.

Figure 6:
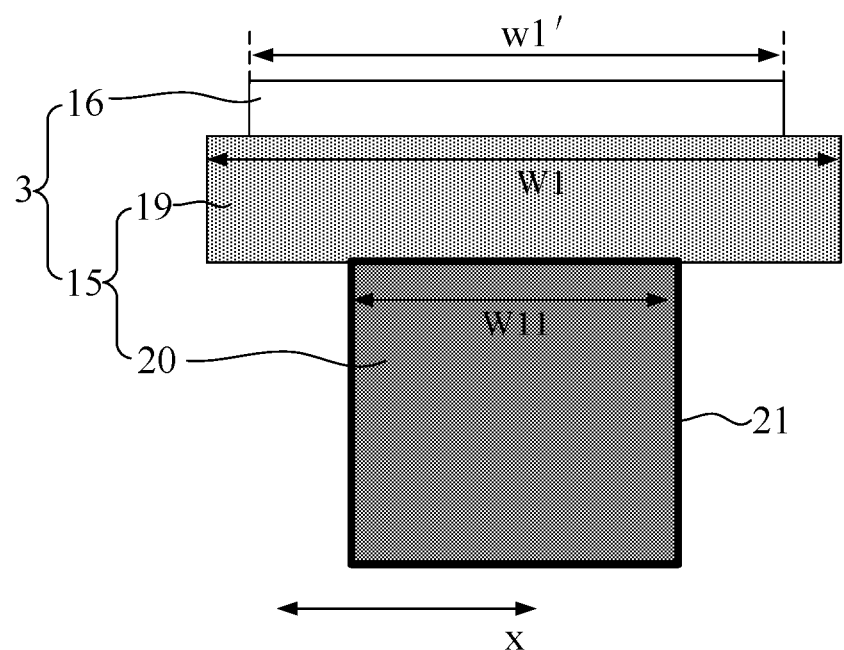
FIG. 6 is a schematic diagram of a second carrier substrate provided by an embodiment of the present disclosure.

FIG. 6 is a schematic diagram of a second carrier substrate provided by an embodiment of the present disclosure. The second carrier substrate 15 includes a flexible bridge base 19 and a bridge thickening layer 20. The second display layer 16 is provided at a side of the flexible bridge base 19 facing towards the light-emitting direction, and the bridge thickening layer 20 is provided at a side of the flexible bridge base 19 facing away from the second display layer 16. By providing the bridge thickening layer 20 at the side of the flexible bridge base 19 facing away from the second display layer 16, the bridge thickening layer 20 can be used to increase an overall thickness of the bridge structure 3, thereby effectively increasing the maximum thickness H1 of the bridge structure 3, and reducing the possibility of the bridge structure 3 of being bent longitudinally.

In an embodiment, a minimum width of the flexible bridge base 19 in the first direction x is smaller than a width w1' of the second display layer 16 in the first direction x. When the bridge structure 3 is thickened and/or width-reduced, the width and the thickness of the flexible bridge base 19 can be adjusted accordingly. By configuring that the minimum width of the flexible bridge base 19 in the first direction x is still be larger than the width w1' of the second display layer 16 in the first direction x, it is possible to avoid that the width of the flexible bridge base 19 is too small, so that all the layers of the second display layer 16 are carried on the flexible bridge base 19, to improve bearing reliability and stability of the flexible bridge base 19 to the second display layer 16.

In an embodiment, referring to FIG. 6 again, the maximum width of the flexible bridge base 19 in the first direction x is W1, the bridge thickening layer 20 has a first sub-cross section 21, the first sub-cross section 21 is perpendicular to the plane of the flexible bridge base 19, and the first sub-cross section 21 is perpendicular to the extending direction of the bridge structure 3, the maximum width of the first sub-cross section 21 in the first direction x is W11, and W11≤W1. With such configuration, an original width of the flexible bridge base 19 cannot be adjusted, instead, by additionally providing the bridge thickening layer 20 having the maximum width smaller than or equal to W1, and using the bridge thickening layer 20 to lower the average width W of the bridge structure 3, when the stretchable display panel is stretched, the work Wx required to bend the bridge structure 3 in the first direction x is further reduced, such that the bridge structure 3 is more inclined to be bent along the first direction x, thereby further avoiding the longitudinal bending of the bridge structure 3.

In an embodiment, referring to FIG. 6 again, the shape of the first sub-cross section 21 is rectangular, and the maximum width W11 of the first sub-cross section 21 in the first direction x is smaller than W1, in this case, under the premise that the bridge thickening layer 20 is used to lower the average width W of the bridge structure 3, the cross section of the second carrier substrate 15 can have a "T" shape, which is equivalent to making the second carrier substrate 15 form a "T"-shaped reinforcing rib structure, thereby further improving torsion resistance of the bridge structure 3, and reducing the risk of longitudinal bending of the bridge structure 3.

Figure 7:
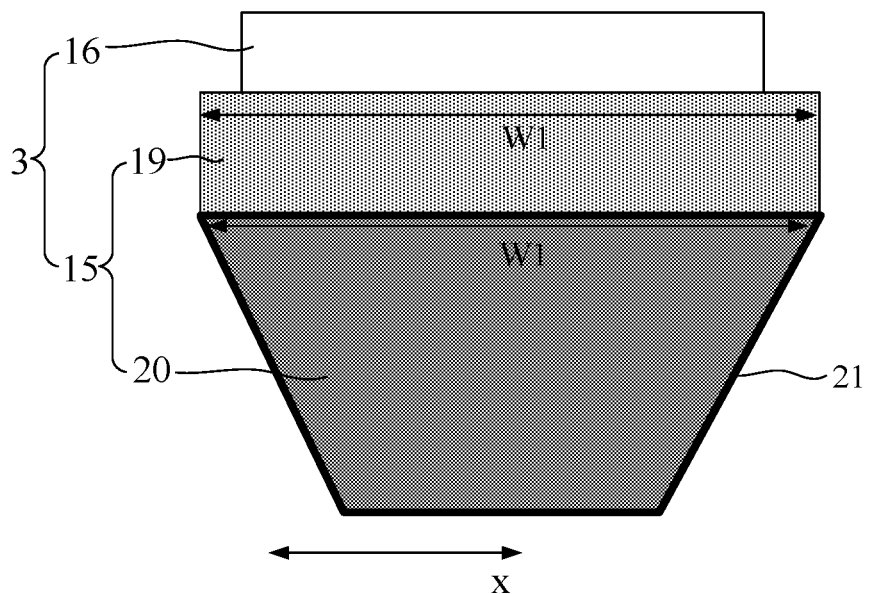
FIG. 7 is a schematic diagram of a second carrier substrate provided by an embodiment of the present disclosure.

FIG. 7 is a schematic diagram of the second carrier substrate provided by an embodiment of the present disclosure. The shape of the first sub-cross section 21 is an inverted trapezoid, and the maximum width of the first sub-cross section 21 in the first direction x is equal to W1. In this case, not only the bridge thickening layer 20 is used to lower the average width W of the bridge structure 3, to make it more inclined to be bent in the first direction x, but also for a surface of the bridge thickening layer 20 being in contact with the flexible bridge base 19, the width of the surface in the first direction x is equal to the maximum width of the flexible bridge base 19 in the first direction x, thus, the bridge thickening layer 20 can also support the flexible bridge base 19 stably.

In an embodiment, along the direction facing away from the second display layer 16, Young's modulus of the bridge thickening layer 20 increases progressively. With such configuration, bottom of the bridge thickening layer 20 at a side facing away from the second display layer 16 has relatively large rigidity, and the bending resistance is relatively high, thus, when the stretchable display panel is stretched, the bridge thickening layer 20 is less likely to drive the bridge structure 3 to be bent in the longitudinal direction.

Figure 8:
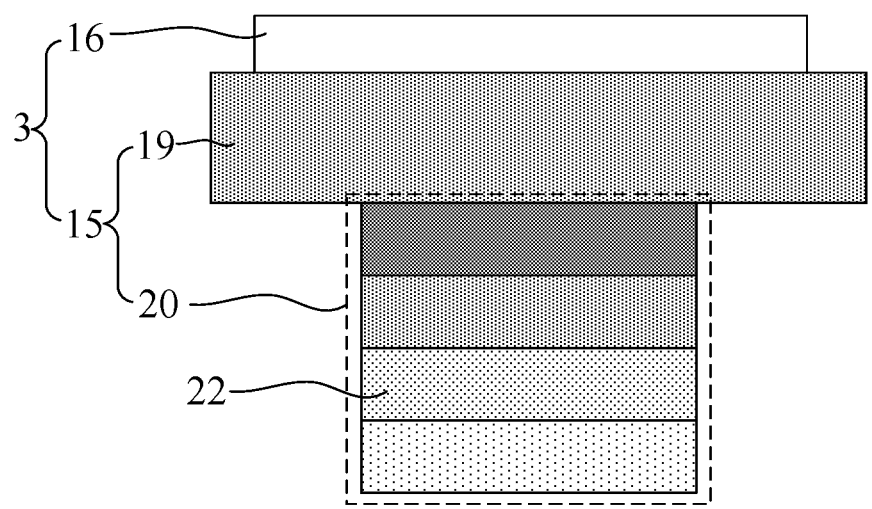
FIG. 8 is a schematic diagram of a second carrier substrate provided by another embodiment of the present disclosure.

FIG. 8 is a schematic diagram of the second carrier substrate provided by another embodiment of the present disclosure, the bridge thickening layer 20 includes a plurality of first thickening sub-layers 22 that is stacked along a direction perpendicular to the plane of the flexible bridge base 19. It can be understood that if a single layer is used to achieve thickening, a thickness of the single layer cannot be set too large due to influence of a process, as a result, degree of thickening of the layer is limited. In the embodiment of the present disclosure, the plurality of first thickening sub-layers 22 is superimposed to form the bridge thickening layer 20, which can not only adjust the overall thickness of the bridge thickening layer 20 be but also achieved a larger degree of thickening.

In an embodiment, along the direction facing away from the second display layer 16, Young's modulus of the plurality of the first thickening sub-layers 22 increases progressively. With such configuration, the farther away the first thickening sub-layer 22 is from the second display layer 16, the larger the rigidity thereof, and the higher the bending resistance thereof. Therefore, when the stretchable display panel is stretched, the first thickening sub-layers 22 having a higher Young's modulus is less likely to drive the bridge structure 3 to be longitudinally bent.

Figure 9:
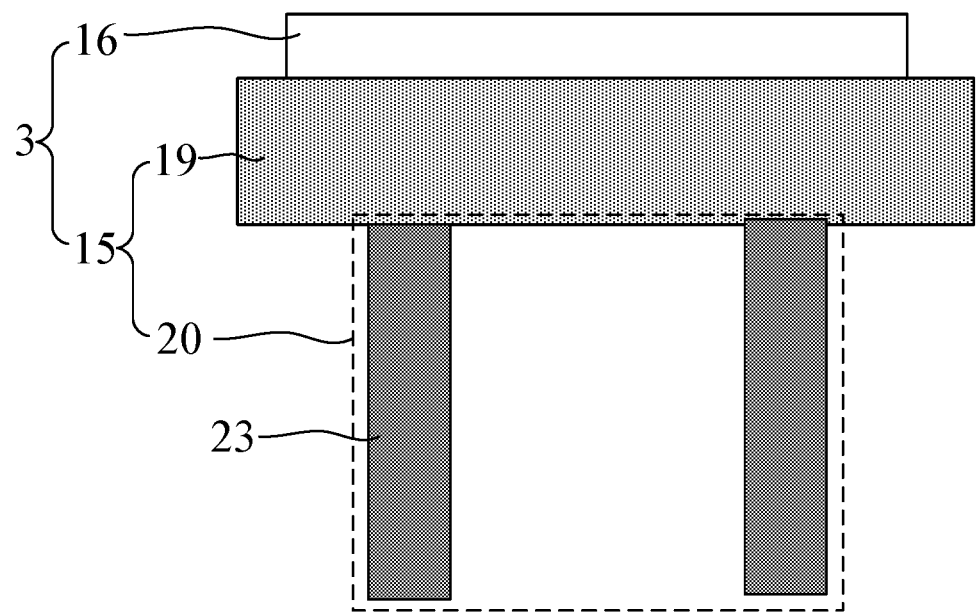
FIG. 9 is a schematic diagram of a second carrier substrate provided by another embodiment of the present disclosure.
Figure 10:
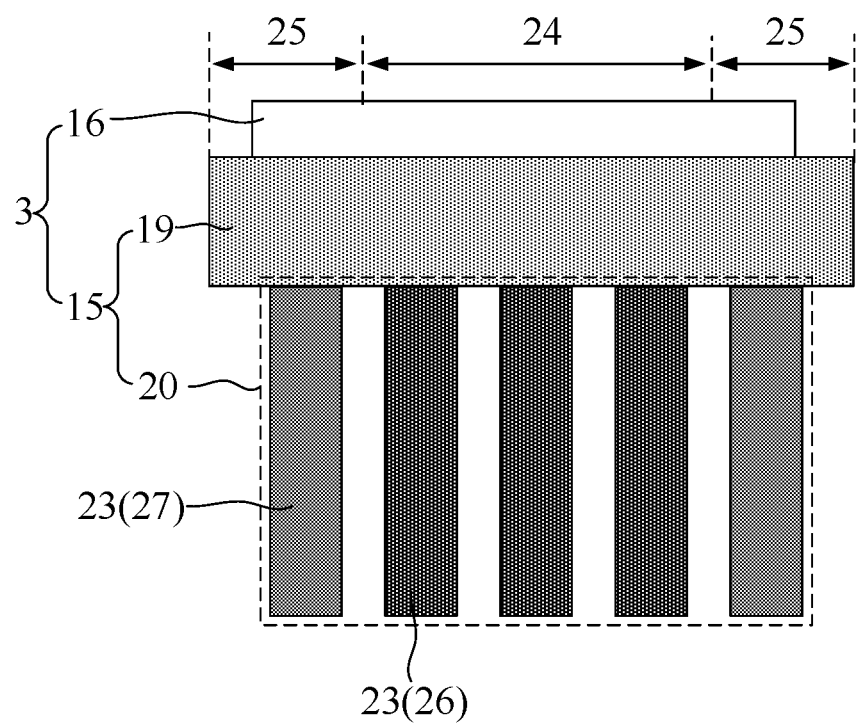
FIG. 10 is a schematic diagram of a second carrier substrate provided by another embodiment of the present disclosure.

FIG. 9 is another schematic diagram of the second carrier substrate provided by the embodiment of the present disclosure, and FIG. 10 is a schematic diagram of a second carrier substrate provided by another embodiment of the present disclosure. The bridge thickening layer 20 includes a plurality of second thickening sub-layers 23 that are spaced apart from each other along a direction parallel to the plane of the flexible bridge base 19. Referring to FIG. 9 again, the bridge thickening layer 20 can include two second thickening sub-layers 23 in such a manner that the second carrier substrate 15 has a "dual fin shape", or referring to FIG. 10 again, the bridge thickening layer 20 can also include two or more second thickening sub-layers 23. When the bridge thickening layer 20 includes a plurality of second thickening sub-layers 23 that is spaced apart from each other, under the premise of using the second thickening sub-layer 23 to achieve thickening, stable support for respective areas of the flexible bridge base 19 can also be achieved.

In addition, in order to improve support of the bridge thickening layer 20, the plurality of the second thickening sub-layers 23 can be evenly distributed.

In an embodiment, referring to FIG. 10 again, an area where the bridge structure 3 is located includes a middle area 24 and a peripheral area 25 surrounding the middle area 24, the second thickening sub-layer 23 includes a middle thickening sub-layer 26 and a peripheral thickening sub-layer 27, the middle thickening sub-layer 26 is located in the middle area 24, the peripheral thickening sub-layer 27 is located in the peripheral area 25, and Young's modulus of the middle thickening sub-layer 26 is larger than Young's modulus of the peripheral thickening sub-layer 27. With such configuration, the middle thickening sub-layer 26 has relatively large rigidity, and the bending resistance is relatively high, thus, when the stretchable display panel is stretched, the middle thickening sub-layer 26 is less likely to drive the bridge structure 3 to be bent in the longitudinal direction.

In an embodiment, the bridge thickening layer 20 and the flexible bridge base 19 are made of the same material, for example, made of flexible materials such as polyimide, and the bridge thickening layer 20 and the flexible bridge base 19 are formed into one piece. In this case, the bridge thickening layer 20 only needs to be formed by the same patterning process as the flexible bridge base 19, which simplifies a process flow of the second carrier substrate 15 and also improves connection stability between the bridge thickening layer 20 and the flexible bridge base 19, preventing the two from being separated from each other when the bridge structure 3 is stretched.

In an embodiment, the bridge thickening layer 20 can also be made of an organic silicon material, such as polydimethylsiloxane (PDMS) material. In this case, the bridge thickening layer 20 is an independent layer structure, and the bridge thickening layer 20 and the flexible bridge base 19 are manufactured by different process flows, making it easier to control the shape, thickness and width of the bridge thickening layer 20 during the manufacturing process.

It should be noted that in other embodiments of the present disclosure, the bridge thickening layer is not provided, and the second carrier substrate 15 includes the flexible bridge base 19 but not a bridge thickening layer, to achieve thickening of the overall structure of the bridge structure 3 through the thickening and/or width-reducing design on the flexible bridge base 19.

In an embodiment, referring to FIG. 3 again, the island structure 2 has a second cross section 28. The second cross section 28 is perpendicular to the plane of the first carrier substrate 4 and perpendicular to the extending direction of the island structure 2. The maximum width of the second cross section 28 in the second direction y is W2, W2>W1, the second direction y is parallel to the plane of the first carrier substrate 4 and perpendicular to the extending direction of the island structure 2. Since the first display layer 5 is configured to arrange the pixel unit 6 therein while the second display layer 16 is configured to arrange the signal line 17 therein, the width of the first display layer 5 is significantly greater than the width of the second display layer 16, and the maximum width W2 of the island structure 2 is greater than the maximum width W1 of the bridge structure 3 in such a manner that the island structure 2 can have enough space to receive the first display layer 5 to improve reliability of functions of the island structure 2.

In an embodiment, the maximum thickness of the island structure 2 in the direction perpendicular to the plane of the first carrier substrate 4 is H2, H2≥W2. Similar to the bridge structure 3, when the stretchable display panel is stretched, under the stretching force, the island structure 2 will also be bent and deformed to a certain degree in different directions. When the island structure 2 is bent in a direction perpendicular to the plane of the first carrier substrate 4 (hereinafter referred to as longitudinal bending), work required is Wz', $Wz'=\frac{1}{2} \cdot \theta'^*H2^3 * W'^* E''$, and when the island structure 2 is bent in the second direction y, work required is Wx', $Wx'=\frac{1}{2} * \theta'^{*W'^3} H2*E'$, where E' is Young's modulus of the island structure 2, w' is an average width of the island structure 2 in the second direction y, W'≤W2, and W'≤H2, θ' is curvature of the island structure 2. It can be seen that with the increase of H2, the work required for the longitudinal bending of the island structure 2 is much greater than the work required for bending in the second direction y. Therefore, when the island structure 2 has a relatively large H2, the island structure 2 is more likely to be bent in the second direction y, but less likely to be bent longitudinally, so as to reduce the possibility of the longitudinal bending of the island structure 2, to further reduce the risk of warping of the stretchable display panel, thereby improving the display performance.

Since W2>W1, H2 can also be made satisfy: H2≥H1, to achieve thickening of the island structure 2 to a greater extent, further reducing the risk of warping of the stretchable display panel caused by the longitudinal bending of the island structure 2.

In addition, it should be noted that when the stretchable display panel is stretched, the deformation amount of the maximum width and the deformation amount of the maximum thickness of the island structure 2 are both relatively small. Therefore, the maximum width and the maximum thickness corresponding to the island structure 2 can refer to the maximum width and the maximum thickness of the island structure 2 when the stretchable display panel is stretched and can also refer to the maximum width and the maximum thickness of the island structure 2 when the stretchable display panel is not stretched.

Figure 11:
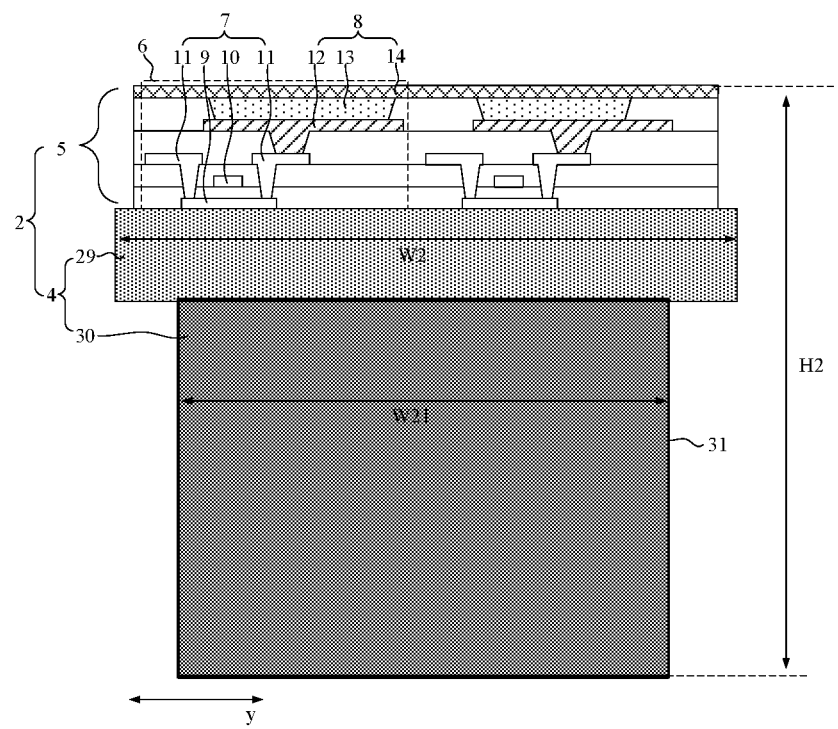
FIG. 11 is a schematic diagram of a first carrier substrate provided by another embodiment of the present disclosure.

FIG. 11 is a schematic diagram of a first carrier substrate provided by an embodiment of the present disclosure, the first carrier substrate 4 includes a flexible island base 29 and an island thickening layer 30, the first display layer 5 is provided at a side of the flexible island base 29 facing towards the light-emitting direction, the island thickening layer 30 is located at a side of the flexible island base 29 facing away from the first display layer 5. By additionally providing the island thickening layer 30 at the side of the flexible island base 29 facing away from the first display layer 5, the island thickening layer 30 can be used to increase the overall thickness of the island structure 2, so as to effectively increase the maximum thickness H1 of the island structure 2 and reduce the possibility of the island structure 2 of being bent longitudinally.

In an embodiment, referring to FIG. 11 again, the width of the flexible island base 29 in the second direction y is W2, the island thickening layer 30 has a second sub-cross section 31 perpendicular to the plane of the first carrier substrate 4 and perpendicular to an extending direction of the island structure 2, a maximum width W21 of the second sub-cross section 31 in the second direction y is smaller than or equal to W2. With such configuration, an original width of the flexible island base 29 cannot be adjusted, instead, the island thickening layer 30 having the maximum width smaller than or equal to W2 is provided and the island thickening layer 30 is used to reduce the average width W' of the island structure 2, so that when the stretchable display panel is stretched, the work Wx' required to bend the island structure 2 in the second direction y is further reduced, making the island structure 2 more inclined to be bent in the second direction y, thereby avoiding longitudinal bending of the island structure 2.

In an embodiment, referring to FIG. 11 again, a shape of the second sub-cross section 31 is rectangular, and the maximum width W21 of the second sub-cross section 31 in the second direction y is smaller than W2. In this case, under the premise that the bridge thickening layer 20 is used to reduce the average width W' of the island structure 2, the cross section of the first carrier substrate 4 can also have a "T" shape, which is equivalent to forming the first carrier substrate 4 into a "T"-shaped reinforcing rib structure, thereby improving the torsion resistance of the island structure 2, and reducing the risk of the longitudinal bending of the island structure 2.

Figure 12:
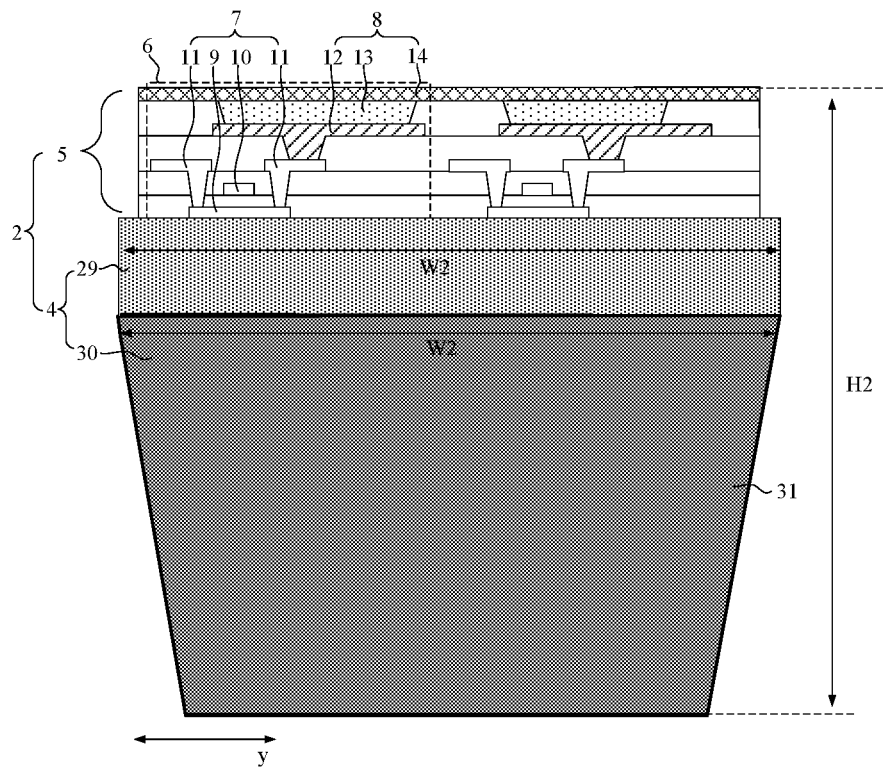
FIG. 12 is a schematic diagram of a first carrier substrate provided by another embodiment of the present disclosure.

FIG. 12 is a schematic diagram of the first carrier substrate provided by another embodiment of the present disclosure. The shape of the second sub-cross section 31 can also be an inverted trapezoid, and the maximum width of the second sub-cross section 31 in the second direction y is equal to W2. In this case, not only the island thickening layer 30 is used to lower the average width W' of the island structure 2, to make it more inclined to be bent in the second direction y, but it can also support the flexible island base 29 stably.

In an embodiment, when the shape of the second sub-cross section 31 is a rectangle or an inverted trapezoid, and along the direction facing away from the first display layer 5, Young's modulus of the island thickening layer 30 increases progressively, in such a manner that bottom of the island thickening layer 30 at a side facing away from the first display layer 4 has relatively large rigidity, and the bending resistance is relatively high, thus, when the stretchable display panel is stretched, the island thickening layer 30 is less likely to drive the island structure 2 to be bent in the longitudinal direction.

Figure 13:
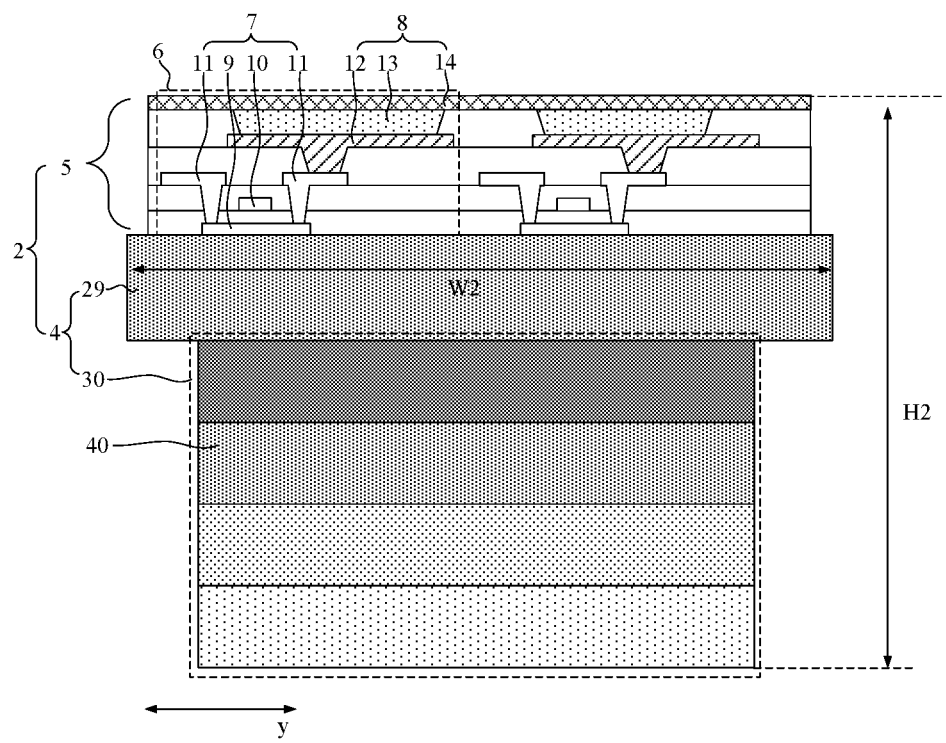
FIG. 13 is a schematic diagram of a first carrier substrate provided by another embodiment of the present disclosure.

FIG. 13 is a schematic diagram of the first carrier substrate provided by another embodiment of the present disclosure, the island thickening layer 30 can also include a plurality of third thickening sub-layers 40, and along a direction perpendicular to the plane of the flexible island base 29, a plurality of the third thickening sub-layers 40 are stacked. With such configuration, not only the overall thickness of the island thickening layer 30 can be better adjusted, but also a larger degree of thickening can be achieved.

In an embodiment, along the direction facing away from the first display layer 4, Young's modulus of the plurality of the third thickening sub-layers 40 increases progressively, in such a manner that the farther away the third thickening sub-layer 40 is from the first display layer 4, the larger the rigidity thereof, and the higher the bending resistance thereof. Therefore, when the stretchable display panel is stretched, the third thickening sub-layers 40 having a higher Young's modulus is less likely to drive the island structure 2 to be longitudinally bent.

Figure 14:
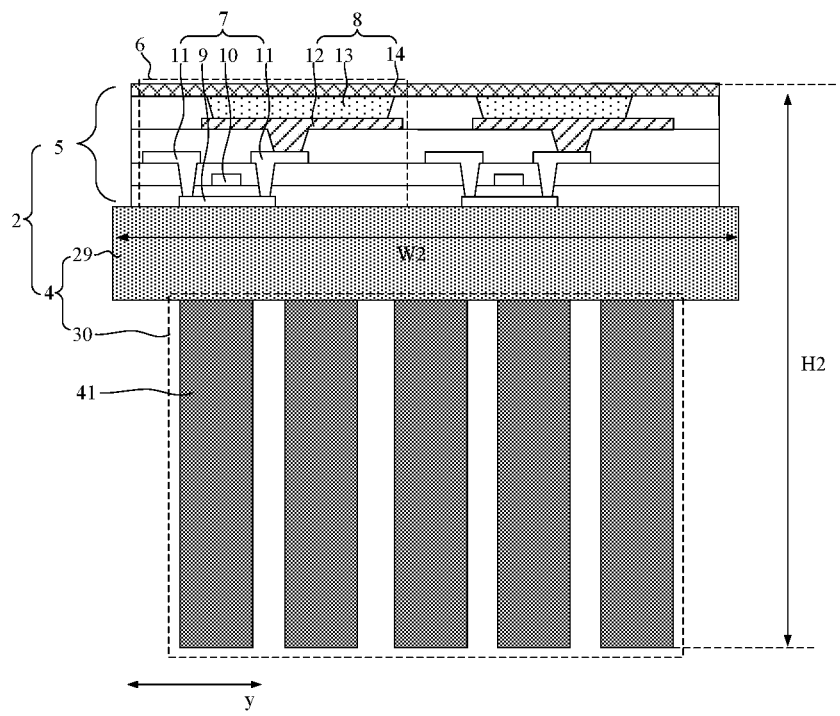
FIG. 14 is a schematic diagram of a first carrier substrate provided by another embodiment of the present disclosure.

FIG. 14 is a schematic diagram of the first carrier substrate provided by another embodiment of the present disclosure. The island thickening layer 30 can also include a plurality of fourth thickening sub-layers 41 that is spaced apart from each other along a direction parallel to the plane of the flexible island base 29 in such a manner that under the premise of using the fourth thickening sub-layers 41 to achieve thickening, stable supporting respective areas of the flexible island base 29 can also be achieved, thereby improving support stability.

In an embodiment, the island thickening layer 30 and the flexible island base 29 are made of the same material, for example, made of flexible materials such as polyimide, and the island thickening layer 30 and the flexible island base 29 are formed into one piece. In this case, the island thickening layer 30 can be formed by the same patterning process as the flexible island base 29, which simplifies a process flow of the first carrier substrate 4 and also improves connection stability between the island thickening layer 30 and the flexible island base 29, preventing the two from being separated from each other when the island structure 2 is stretched.

In an embodiment, the island thickening layer 30 can also be made of an organic silicon material, such as polydimethylsiloxane (PDMS) material. In this case, the island thickening layer 30 is an independent layer structure, and the island thickening layer 30 and the flexible island base 29 are manufactured by different process flows, making it easier to control the shape, thickness and width of the island thickening layer 30 during the manufacturing process.

Figure 15:
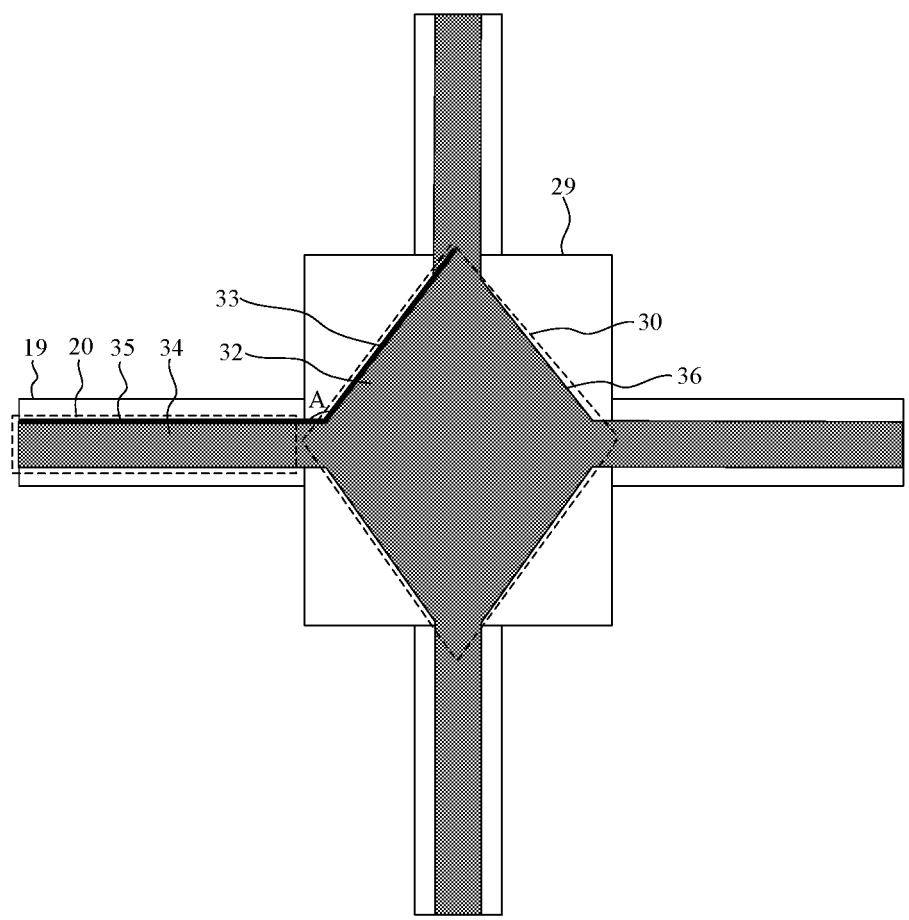
FIG. 15 is a schematic diagram of a bridge thickening layer and an island thickening layer provided by an embodiment of the present disclosure.

FIG. 15 is a schematic diagram of the bridge thickening layer and the island thickening layer provided by an embodiment of the present disclosure, wherein the bridge thickening layer 20 is connected to the island thickening layer 30, and the bridge thickening layer 20 and the island thickening layer 30 are formed into one piece. In this case, the bridge thickening layer 20 and the island thickening layer 30 can be formed by the same patterning process, which simplifies the process flow and reduces the manufacturing cost.

In an embodiment, referring to FIG. 15 again, the island thickening layer 30 has a first top surface 32 and a first side surface 33, the first top surface 32 is parallel to the plane of the flexible island base 29, and the first top surface 32 is located at a side of the island thickening layer 30 close to the flexible island base 29, the first side surface 33 intersects the first top surface 32, the bridge thickening layer 20 has a second top surface 34 and a second side surface 35, the second top surface 34 is parallel to the plane of the flexible bridge base 19 and is located at a side of the bridge thickening layer 20 close to the flexible bridge base 19, the second side surface 35 intersects the second top surface 34, an included angle between the first side surface 33 and the second side surface 35 connected to the first side surface is A, A≥120°, so as to better disperse the stress when the stretchable display panel is stretched, thereby preventing breaking between the first side surface 33 and the second side surface 35, and improving the connection stability between the island thickening layer 30 and the bridge thickened layer 20.

Figure 16:
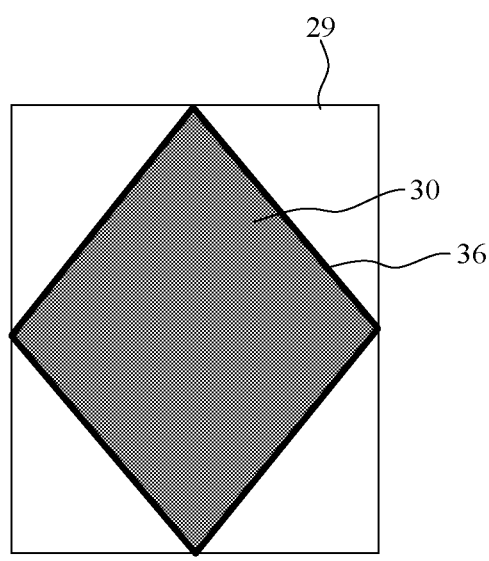
FIG. 16 is a top diagram of an island thickening layer provided by an embodiment of the present disclosure.

In an embodiment, when the included angle A between the first side surface 33 and the second side surface 35 connected to the first side surface is greater than or equal to 120°, in order to improve regularity of the shape of the island thickening layer 30, as shown in FIG. 16 which is a top view of an island thickening layer provided by an embodiment of the present disclosure, the island thickening layer 30 has a third cross section 36 parallel to the plane of the first carrier substrate 4, and a shape of the third cross section 36 is a rhombus.

Figure 17:
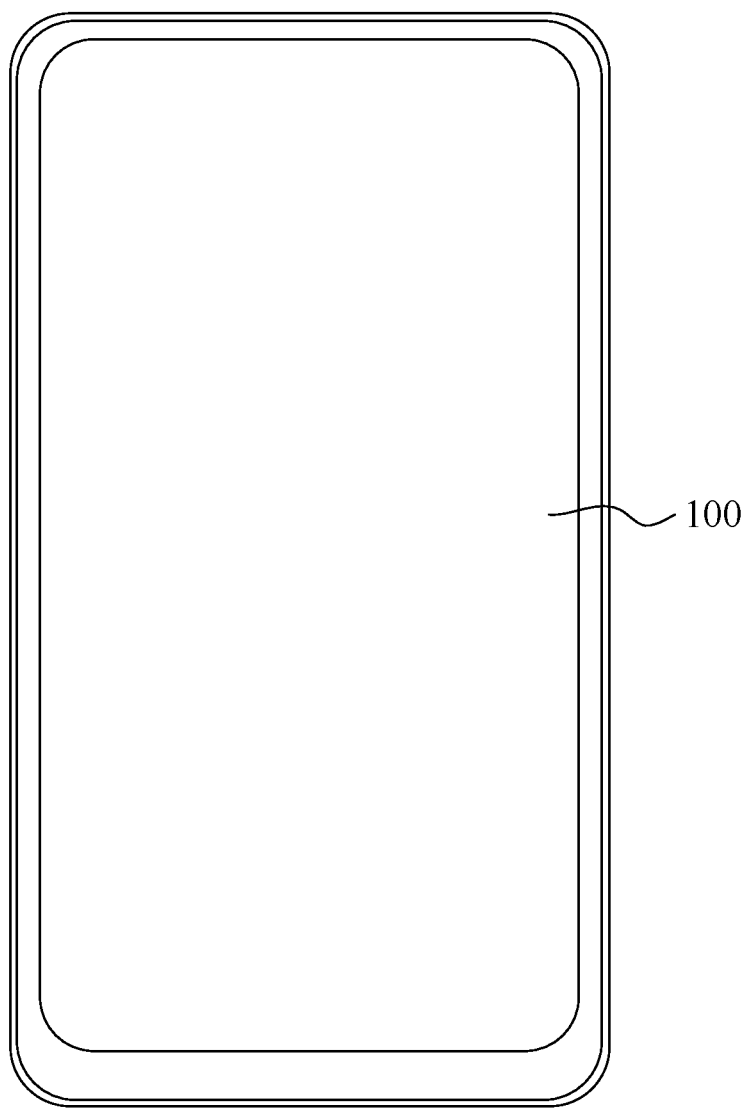
FIG. 17 is a schematic diagram of a stretchable display device provided by an embodiment of the present disclosure.

An embodiment of the present disclosure further provides a stretchable display device, as shown in FIG. 17 which is a schematic diagram of a stretchable display device according to an embodiment of the present disclosure, and the stretchable display device includes the stretchable display panel 100 described above. The structure of the stretchable display panel 100 has been described in detail in the above embodiments and will not be repeated herein. Without doubt, the stretchable display device shown in FIG. 17 is only a schematic illustration, and the stretchable display device can be any electronic device with a display function such as a mobile phone, a tablet computer, a notebook computer, an electronic paper book, or a television.

Since the stretchable display device provided by the embodiment of the present disclosure includes the above stretchable display panel, with the stretchable display device, by thickening and/or width-reducing the bridge structure 3 in the stretchable display panel, and making the maximum thickness H1 of the bridge structure 3 greater than or equal to the maximum width W1, the bridge structure 3 can have a relatively large thickness, so that when the stretchable display panel is stretched, relatively large work is required to make the bridge structure 3 be bent longitudinally, to reduce the possibility of the longitudinal bending of the bridge structure 3, thereby reducing the risk of warping of the stretchable display panel, and improving the display performance.

The above are only some embodiments of the present disclosure and are not intended to limit the present disclosure. Any modification, equivalent replacement, improvement, etc. made within the spirit and principle of the present disclosure should be included in the scope of protection of the present disclosure.

It should be noted that the various embodiments above are only used to illustrate the technical solution of the present disclosure, rather than limiting; although the present disclosure has been described in detail with reference to the various embodiments above, those of ordinary skill in the art should understand that: they can still modify the technical solutions described in the various embodiments above or equivalently replace some or all of the technical features; while these modifications or replacements do not cause the essence of the corresponding technical solutions to depart from the scope of the technical solutions of the various embodiments of the present disclosure.

What is claimed is:

1. A stretchable display panel, comprising:
   a stretchable substrate comprising a plurality of island structures and a plurality of bridge structures,
   wherein the plurality of island structures is spaced apart from each other, and two adjacent island structures of the plurality of island structures are connected by one bridge structure of the plurality of bridge structures;
   wherein each of the plurality of island structures comprises a first carrier substrate and a first display layer, wherein the first display layer is disposed at a side of the first carrier substrate facing towards a light-emitting direction of the stretchable display panel and comprises a pixel unit;
   wherein each of the plurality of bridge structures comprises a second carrier substrate and a second display layer, wherein the second display layer is disposed at a side of the second carrier substrate facing towards the light-emitting direction and comprises a signal line electrically connected to the pixel unit; and
   wherein each of the plurality of bridge structures has a first cross section perpendicular to a plane of the second carrier substrate and perpendicular to an extending direction of the bridge structure, a maximum width of the first cross section in a first direction is equal to W1, a maximum thickness of the bridge structure in a direction perpendicular to the plane of the second carrier substrate is equal to H1, H1≥W1, and the first direction is parallel to the plane of the second carrier substrate and perpendicular to the extending direction of the bridge structure.

2. The stretchable display panel according to claim 1, wherein the second carrier substrate comprises:
   a flexible bridge base, the second display layer being provided at a side of the flexible bridge base facing towards the light-emitting direction;
   a bridge thickening layer arranged at a side of the flexible bridge base facing away from the second display layer.

3. The stretchable display panel according to claim 2, wherein a minimum width of the flexible bridge base in the first direction is greater than a width of the second display layer in the first direction.

4. The stretchable display panel according to claim 2, wherein a maximum width of the flexible bridge base in the first direction is equal to W1, the bridge thickening layer has a first sub-cross section perpendicular to a plane of the flexible bridge base and perpendicular to the extending direction of the bridge structure, and a maximum width of the first sub-cross section in the first direction is smaller than or equal to W1.

5. The stretchable display panel according to claim 4, wherein the first sub-cross section has a shape of rectangle, and the maximum width of the first sub-cross section in the first direction is smaller than W1.

6. The stretchable display panel according to claim 4, wherein the first sub-cross section has a shape of inverted trapezoid, and the maximum width of the first sub-cross section in the first direction is equal to W1.

7. The stretchable display panel according to claim 4, wherein along a direction facing away from the second display layer, a Young's modulus of the bridge thickening layer increases.

8. The stretchable display panel according to claim 4, wherein the bridge thickening layer comprises a plurality of first thickening sub-layers that is stacked along a direction perpendicular to the plane of the flexible bridge base.

9. The stretchable display panel according to claim 8, wherein a Young's modulus of the plurality of first thickening sub-layers increases in a direction facing away from the second display layer.

10. The stretchable display panel according to claim 4, wherein the bridge thickening layer comprises a plurality of second thickening sub-layers spaced apart from each other along a direction parallel to the plane of the flexible bridge base.

11. The stretchable display panel according to claim 10, wherein an area where each of the plurality of bridge structures is located comprises a middle area and a peripheral area surrounding the middle area, and the plurality of second thickening sub-layers comprises at least one middle thickening sub-layer and at least two peripheral thickening sub-layers, wherein the at least one middle thickening sub-layer is located in the middle area, the at least two peripheral thickening sub-layers are located in the peripheral area, and a Young's modulus of one of the at least one middle thickening sub-layer is greater than a Young's modulus of one of the at least two peripheral thickening sub-layers.

12. The stretchable display panel according to claim 2, wherein each of the plurality of island structures has a second cross section perpendicular to a plane of the first carrier substrate and perpendicular to an extending direction of the island structure, a maximum width of the second cross section in a second direction is equal to W2, W2>W1, the second direction is parallel to the plane of the first carrier substrate and perpendicular to the extending direction of the island structure.

13. The stretchable display panel according to claim 12, wherein each of the plurality of island structures has a maximum thickness H2 in a direction perpendicular to the plane of the first carrier substrate, and H2 is equal to or greater than W2.

14. The stretchable display panel according to claim 13, wherein H2 is equal to or greater than H1.

15. The stretchable display panel according to claim 13, wherein the first carrier substrate comprises:
a flexible island base, the first display layer being provided at a side of the flexible island base facing towards the light-emitting direction; and
an island thickening layer located at a side of the flexible island base facing away from the first display layer.

16. The stretchable display panel according to claim 15, wherein a width of the flexible island base in the second direction is equal to W2, the island thickening layer has a second sub-cross section perpendicular to the plane of the first carrier substrate and perpendicular to the extending direction of the island structure, and a maximum width of the second sub-cross section in the second direction is smaller than or equal to W2.

17. The stretchable display panel according to claim 15, wherein the bridge thickening layer and the island thickening layer are connect to each other and are formed into one piece.

18. The stretchable display panel according to claim 17, wherein the island thickening layer has a first top surface and a first side surface that intersect with each other, wherein the first top surface is parallel to a plane of the flexible island base and is located at a side of the island thickening layer close to the flexible island base;
wherein the bridge thickening layer has a second top surface and a second side surface that intersect with each other, wherein the second top surface is parallel to the plane of the flexible bridge base and is located at a side of the bridge thickening layer close to the flexible bridge base; and
wherein an included angle between the first side surface and the second side surface connected to the first side surface is equal to or greater than 120°.

19. The stretchable display panel according to claim 18, wherein the island thickening layer has a third cross section parallel to the plane of the first carrier substrate and having a shape of a rhombus.

20. A stretchable display device, comprising a stretchable display panel, wherein the stretchable display panel comprises:
a stretchable substrate comprising a plurality of island structures and a plurality of bridge structures,
wherein the plurality of island structures is spaced apart from each other, and two adjacent ones of the plurality of island structures are connected by one of the plurality of bridge structures;
wherein each of the plurality of island structures comprises a first carrier substrate and a first display layer, wherein the first display layer is disposed at a side of the first carrier substrate facing towards a light-emitting direction of the stretchable display panel and comprises a pixel unit;
wherein each of the plurality of bridge structures comprises a second carrier substrate and a second display layer, wherein the second display layer is disposed at a side of the second carrier substrate facing towards the light-emitting direction and comprises a signal line electrically connected to the pixel unit; and
wherein each of the plurality of bridge structures has a first cross section perpendicular to a plane of the second carrier substrate and perpendicular to an extending direction of the bridge structure, a maximum width of the first cross section in a first direction is W1, a maximum thickness of the bridge structure in the direction perpendicular to the plane of the second carrier substrate is H1, where H1≥W1, and the first direction is parallel to the plane of the second carrier substrate and perpendicular to the extending direction of the bridge structure.

* * * * *